(12) United States Patent
Liu et al.

(10) Patent No.: US 11,258,449 B2
(45) Date of Patent: Feb. 22, 2022

(54) CLOCK DATA RECOVERY APPARATUS AND CLOCK DATA RECOVERY METHOD

(71) Applicant: REALTEK SEMICONDUCTOR CORPORATION, Hsinchu (TW)

(72) Inventors: Yao-Chia Liu, Chiayi (TW); Bo-Yu Chen, Taichung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/840,853

(22) Filed: Apr. 6, 2020

(65) Prior Publication Data

US 2021/0099178 A1 Apr. 1, 2021

(30) Foreign Application Priority Data

Oct. 1, 2019 (TW) ................................ 108135566

(51) Int. Cl.
*H03L 7/091* (2006.01)
*H03L 7/093* (2006.01)
(Continued)

(52) U.S. Cl.
CPC ............ *H03L 7/091* (2013.01); *H03L 7/0807* (2013.01); *H03L 7/0814* (2013.01); *H03L 7/093* (2013.01)

(58) Field of Classification Search
CPC .... H03D 13/003; H03D 13/00; H03D 13/004; H03D 2200/006; H03D 2200/0062;
(Continued)

(56) References Cited

U.S. PATENT DOCUMENTS 6,122,336 A * 9/2000 Anderson ............. H04L 7/0337
375/371
8,787,515 B2 7/2014 Chen
(Continued)

FOREIGN PATENT DOCUMENTS

| TW | 201318349 A1 | 5/2013 |
| TW | 201541922 A | 11/2015 |
| TW | 201711397 A | 3/2017 |

OTHER PUBLICATIONS

Ma et al. "A Quadrature Clock Generator with Calibration for 22~31.4 GS/s Real-time Sampling System", 2015 IEEE, ESSCIRC Conference 2015—41st European Solid-State Circuits Conference (ESSCIRC), Graz, Austria.
(Continued)

*Primary Examiner* — Vineeta S Panwalkar
(74) *Attorney, Agent, or Firm* — WPAT, PC

(57) ABSTRACT

The present disclosure provides a clock data recovery apparatus. The clock data recovery apparatus includes a phase detection circuit, a digital filter, a phase-interpolating circuit and an oscillator circuit. The phase detection circuit receives and samples a data signal according to multiple reference clock signals having different phases, to generate a phase detection result. The digital filter performs accumulation on the phase detection result, to generate a phase-adjusting signal. The phase interpolator circuit performs phase adjustment on a source clock signal according to the phase-adjusting signal, in order to generate an injection clock signal. The oscillator circuit generates the reference clock signals according to the injection clock signal, in which the phases of the reference clock signals follow the phase of the injection clock signal.

18 Claims, 5 Drawing Sheets

(51) Int. Cl.
*H03L 7/081* (2006.01)
*H03L 7/08* (2006.01)

(58) Field of Classification Search
CPC ..... H03L 7/091; H03L 7/0807; H03L 7/0814; H03L 7/093; H03L 7/099; H03L 7/24
See application file for complete search history.

(56) References Cited

U.S. PATENT DOCUMENTS

| | | | |
|---|---|---|---|
| 9,432,176 B2 | 8/2016 | Yu et al. | |
| 9,673,795 B2 | 6/2017 | Weng et al. | |
| 2007/0146014 A1* | 6/2007 | Cheung | H03L 7/091 327/20 |
| 2014/0037036 A1* | 2/2014 | Nedovic | H04L 7/0337 375/374 |
| 2016/0013928 A1* | 1/2016 | Tsuiji | H04L 7/0331 375/362 |

OTHER PUBLICATIONS

Lee et al. "Study of Subharmonically Injection-Locked PLLs", pp. 1539-1553, IEEE Journal of Solid-State Circuits vol. 44, Issue: 5, May 2009.

OA letter ol the counterpart TW application (appl. No. 108135566) dated Jul. 24, 2020. Summary of the OA letter:1. Claims 1~2, 4 and 8 are rejected as being unpatentable over the disclosure of the cited reference 1 (TW 201541922A, also published as U.S. Pat. No. 9,432,176B2) and the cited reference 2 (TW 201318349A, also published as U.S. Pat. No. 8,787,515B2). 2. Claim 3 is rejected as being unpatentable over the disclosure of the cited reference 1, the cited reference 2 and the cited reference 3 (TW 201711397A, also published as U.S. Pat. No. 9,673,795B2). 3. Claims 5~7 and 9 are allowed.

* cited by examiner

CLOCK DATA RECOVERY APPARATUS AND CLOCK DATA RECOVERY METHOD

BACKGROUND OF THE INVENTION

1. Field of the Invention

The present disclosure relates to a clock data recovery apparatus and clock data recovery method.

2. Description of Related Art

Under high speed data transmission, noise may be generated and distortion may occur on the digital data since the synchronization clock signal is not transmitted along with the digital data. As a result, a clock data recovery circuit is required in a transceiver to regenerate the clock signal and recover the data with a low amount of noise.

The current clock data recovery circuit can be implemented by either an analog signal or a digital circuit. However, when an instant frequency deviation occurs while switching from the frequency lock mode to the phase lock mode, the analog circuit is prone to fail locking the clock phase. Further, the noise is easy to be accumulated under the condition that no data transition occurs for a long time when the analog circuit is used. On the other hand, the delay time of digital clock recovery circuit is longer. Under the condition that the frequency deviation is large, the ability of the digital circuit to track the phase back is limited and the bit error rate would become worse. Moreover, the performance of linearity of the digital circuit is not satisfying as well. Therefore, both of the analog circuit and the digital circuit have disadvantages that are not easy to overcome.

SUMMARY OF THE INVENTION

In consideration of the problem of the prior art, an object of the present disclosure is to provide a clock data recovery apparatus and clock data recovery method to include the advantages of both the digital circuit and the analog circuit to recover the clock data stably and accurately.

The present disclosure provides a clock data recovery apparatus that includes a phase detection circuit, a digital filter, a phase-interpolating circuit and an oscillator circuit. The phase detection circuit is configured to receive and sample a data signal according to multiple reference clock signals having different phases, to generate a phase detection result. The digital filter is configured to perform accumulation on numbers of times that the reference clock signals phase-lead and phase-lag the data signal according to the phase detection result, to generate a phase-adjusting signal. The phase-interpolating circuit is configured to perform phase adjustment on a source clock signal according to the phase-adjusting signal, in order to generate an injection clock signal. The oscillator circuit is configured to generate the reference clock signals according to the injection clock signal, in which the phases of the reference clock signals follow the phase of the injection clock signal.

The present disclosure also provides a clock data recovery method used in a clock data recovery apparatus that includes the steps outlined below. A data signal is received and sampled by a phase detection circuit according to multiple reference clock signals having different phases, to generate a phase detection result. Accumulation is performed on numbers of times that the reference clock signals phase-lead and phase-lag the data signal by a digital filter according to the phase detection result, to generate a phase-adjusting signal. Phase adjustment is performed on a source clock signal by a phase-interpolating circuit according to the phase-adjusting signal, in order to generate an injection clock signal. The reference clock signals are generated by an oscillator circuit according to the injection clock signal, in which the phases of the reference clock signals follow the phase of the injection clock signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present disclosure is to provide a clock data recovery apparatus and a clock data recovery method to include the advantages of both the digital circuit and the analog circuit. The clock data can be recovered stably and accurately. In some embodiments, the clock data recovery apparatus can provide a quick phase locking mechanism.

Figure 1:
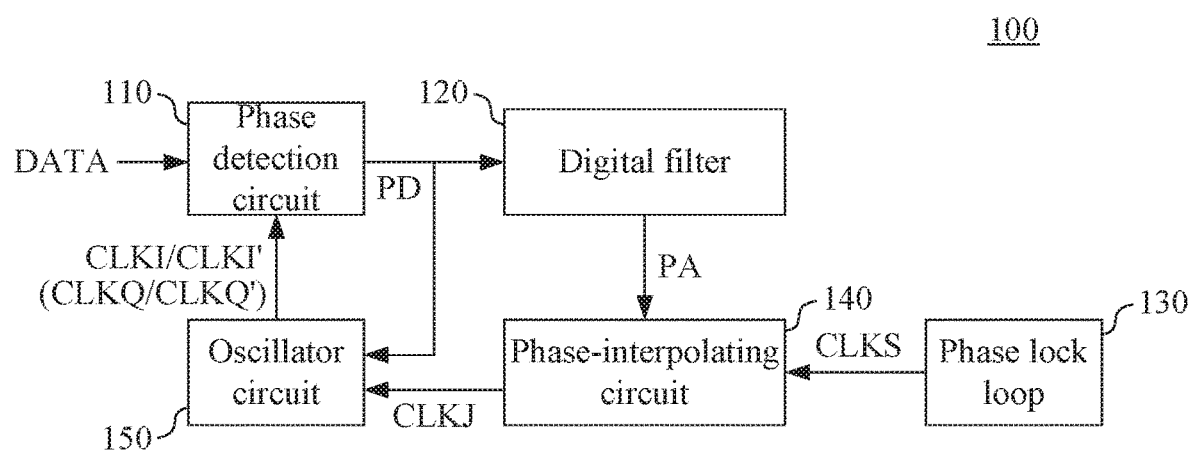
FIG. 1 illustrates a block diagram of a clock data recovery apparatus according to an embodiment of the present disclosure.

Reference is now made to FIG. 1. FIG. 1 illustrates a block diagram of a clock data recovery apparatus 100 according to an embodiment of the present disclosure. The clock data recovery apparatus 100 is configured to receive a data signal DATA and reconstruct the clock data related to the data signal DATA according to the data signal DATA.

The clock data recovery apparatus 100 includes a phase detection circuit 110, a digital filter 120, a phase lock loop 130, a phase-interpolating circuit 140 and an oscillator circuit 150. By using the feedback mechanism of the circuits described above, the clock data recovery apparatus 100 is able to keep tracking the phase of the data signal DATA and reconstruct the clock included in the data signal DATA.

The configuration and operation mechanism of each of the circuits are described in detail in the following paragraphs.

In an embodiment, the clock data recovery apparatus 100 operates under full rate. Under such a condition, the clock data recovery apparatus 100 is configured to receive and sample the data signal DATA by two reference clock signals CLKI and CLKI' having a phase difference of 180 degrees to generate a phase detection result PD. The two reference clock signals CLKI and CLKI' have the same frequency as the data signal DATA.

Figure 2A:
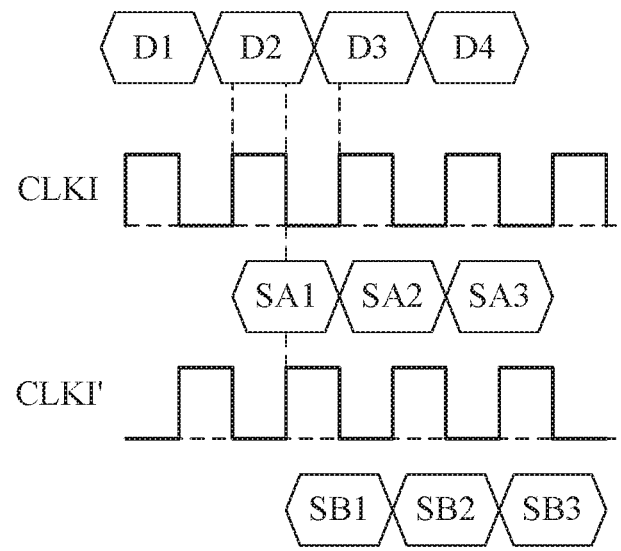
FIG. 2A illustrates a diagram of a plurality pieces of data of the data signal, the reference clock signals and the sampled results according to an embodiment of the present disclosure.

Reference is now made to FIG. 2A. FIG. 2A illustrates a diagram of a plurality pieces of data D1~D4 of the data signal DATA, the reference clock signals CLKI and CLKI' and the sampled results SA1~SA3 and SB1~SB3 according to an embodiment of the present disclosure.

In the full rate mode, the period of each of the reference clock signals CLKI and CLKI' equals to the transmission time of one piece of data. The sampled results SA1~SA3 of the reference clock signal CLKI represent the relations between the rising edge of the reference clock signal CLKI and the rising edges of the corresponding data, e.g., the data D2, D4 and D6. Further, the sampled results SB1~SB3 of the reference clock signal CLKI' is further used to confirm whether the rising edges of the reference clock signal CLKI phase-lead or phase-lag the rising edges of the corresponding data.

The phase detection circuit 110 samples the data signal DATA according to two consecutive rising edges of the reference clock signal CLKI and the rising edge of the reference clock signal CLKI' between the two consecutive rising edges of the reference clock signal CLKI to generate three sampled results and generate the phase detection result PD according to the relation of these three sampled results.

Take the three consecutive sampled results SA1, SB1 and SA2 in FIG. 2A as an example, when the first two of the sampled results SA1 and SB1 are the same, e.g., (001) or (110), the rising edge of the data D2 locates between the rising edge of the reference clock signal CLKI' and the delayed rising edge of the reference clock signal CLKI such that the reference clock signal CLKI' and the delayed reference clock signal CLKI sample the same values. The phase detection result PD shows that the reference clock signal CLKI phase-lags the data signal DATA.

When the last two of the sampled results SB1 and SA2 are the same, e.g., (011) or (100), the rising edge of the data D2 locates between the rising edge of the reference clock signal CLKI and the rising edge of the reference clock signal CLKI' such that the reference clock signal CLKI and the reference clock signal CLKI' sample the same values. The phase detection result PD shows that the reference clock signal CLKI phase-leads the data signal DATA.

When the three sampled results SA1, SB1 and SA2 are the same, e.g., (111) or (000), the data signal DATA does not have transition. The relation between the phase of the reference clock signal CLKI and the data signal DATA can not be determined.

In practical implementation, the phase detection circuit 110 may include a plurality of flip-flops and a plurality of logic operation gates. The flip-flops are configured to sample the data signal DATA according to the reference clock signals CLKI and CLKI' to generate the sampled results and the logic operation gates are configured to perform logic operation on the sampled results to generate a logic operation result that can identify whether the reference clock signals phase-lead or lag the data signal DATA as the phase detection result PD.

Figure 2B:
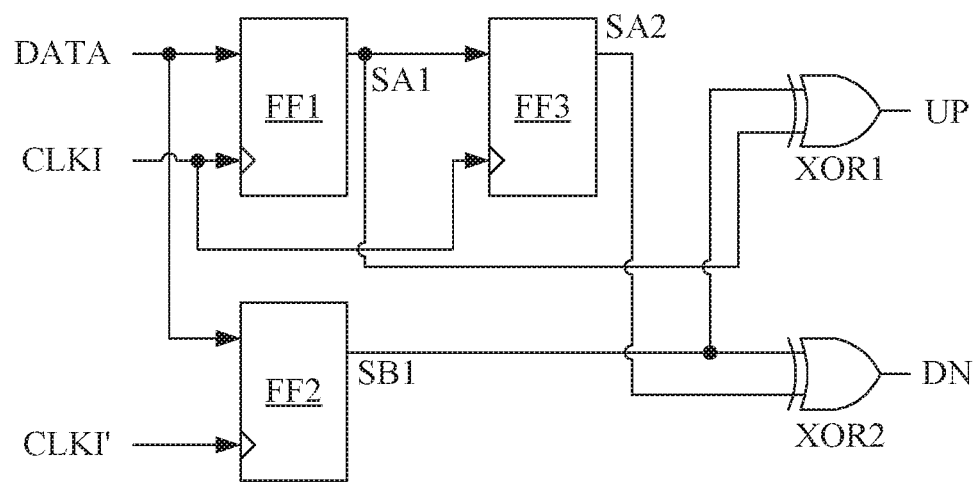
FIG. 2B illustrates a block diagram of the phase detection circuit according to an embodiment of the present disclosure.

FIG. 2B illustrates a block diagram of the phase detection circuit 110 according to an embodiment of the present disclosure. The phase detection circuit 110 can be used to implement the full rate phase detection and includes three flip-flops FF1~FF3 and two exclusive OR gates XOR1 and XOR2.

The flip-flops FF1~FF3 respectively perform sampling according to the reference clock signals CLKI and CLKI' to generate the sampled results, e.g., the sampled results SA1, SB1 and SA2 described above. The exclusive OR gate XOR1 performs logic operation on the sampled results SA1 and SB1 to generate a logic operation result UP. The exclusive OR gate XOR2 performs logic operation on the sampled results SB1 and SB2 to generate a logic operation result DN.

When the first two sampled results SA1 and SB1 are the same, e.g., (001) or (110), the logic operation result UP from the exclusive OR gate XOR1 is 0 and the logic operation result DN from the exclusive OR gate XOR2 is 1. Such sampled results represent a "phase-lag" condition. When the last two sampled results SB1 and SA2 are the same, e.g., (011) or (100), the logic operation result UP from the exclusive OR gate XOR1 is 1 and the logic operation result DN from the exclusive OR gate XOR2 is 0. Such sampled results represent a "phase-lead" condition. When the three sampled results SA1, SB1 and SA2 are the same, e.g., (111) or (000), the logic operation result UP and the logic operation result DN from the exclusive OR gate XOR1 and the exclusive OR gate XOR2 are both 1. Such sampled results represent an unidentifiable condition.

As a result, in practical implementation, the phase detection result PD in FIG. 1 can be realized by the logic operation results UP and DN illustrated in FIG. 2B.

In another embodiment, the clock data recovery apparatus 100 operates under half rate. Under such a condition, the phase detection circuit 110 is configured to receive the data signal DATA and perform sampling according to four reference clock signals CLKI, CLKQ, CLKI' and CLKQ' each having a frequency that is half of the frequency of the data signal DATA and arranged in an order having a phase difference of 90 degrees between each two reference clock signals in the order to generate the phase detection result PD according to the sampled results.

Figure 3:
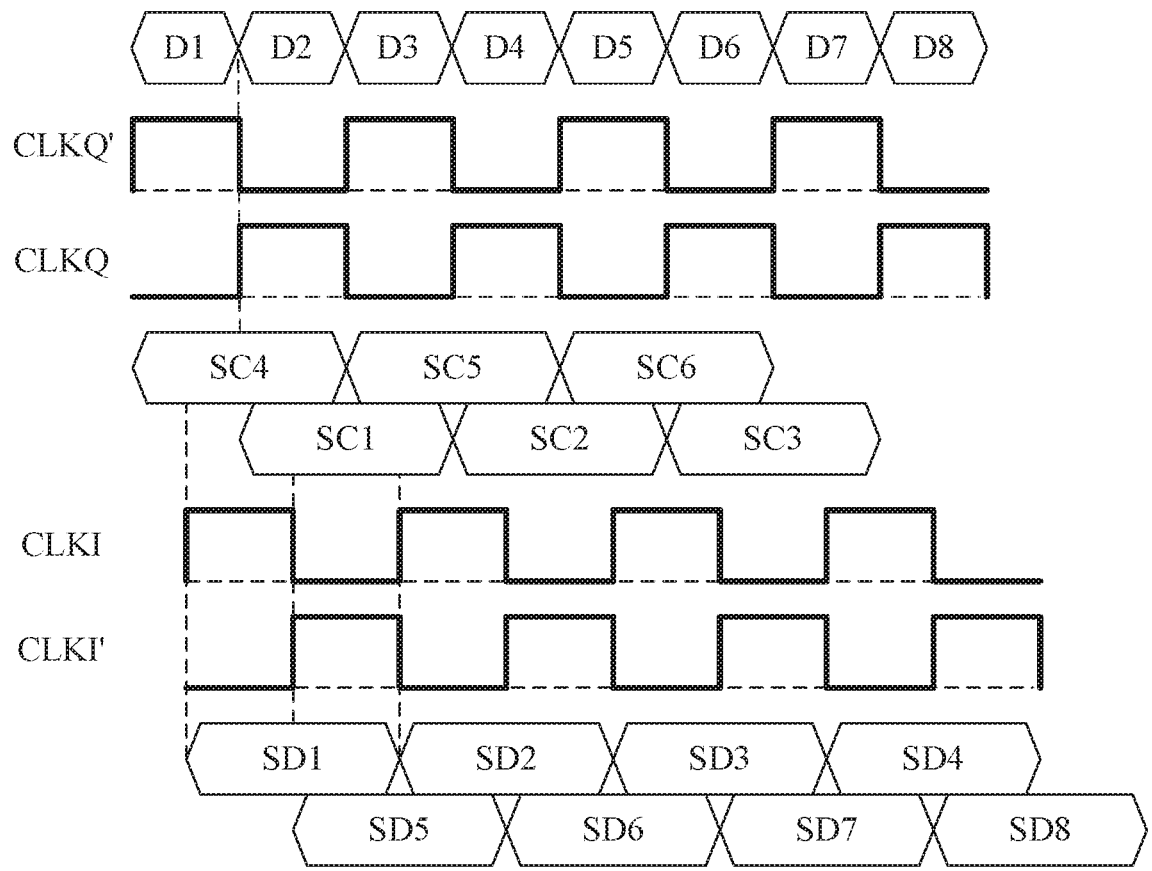
FIG. 3 illustrates a diagram of a plurality pieces of data of the data signal, the reference clock signals and the sampled results according to another embodiment of the present disclosure.

Reference is now made to FIG. 3. FIG. 3 illustrates a diagram of a plurality pieces of data D1~D8 of the data signal DATA, the reference clock signals CLKI, CLKQ, CLKI' and CLKQ' and the sampled results SC1~SC6 and SD1~SD8 according to another embodiment of the present disclosure.

In the half rate mode, the period of each of the reference clock signals CLKI, CLKQ, CLKI' and CLKQ' equals to the transmission time of two pieces of data. The sampled result SC1~SC6 of the reference clock signal CLKQ and CLKQ' represent the relation between the rising edge of the reference clock signals CLKQ and CLKQ' and the rising edges of the corresponding data. For example, the sampled results SC1~SC3 of the reference clock signal CLKQ represents the relation between the rising edges of the reference clock signal CLKQ and the data D2, D4 and D6. Further, the sampled results SC4~SC6 of the reference clock signal CLKQ' represents the relation between the rising edges of the reference clock signal CLKQ' and the rising edges of the corresponding data D3, D5 and D7.

Further, the sampled results SD1~SD8 confirm whether the rising edges of the reference clock signals CLKQ and CLKQ' lead or lag the rising edges of the corresponding data. For example, the sampled results SD1~SD4 correspond to the data D1, D3, D5 and D7. The sampled results SD5~SD8 correspond to the data D2, D4, D6 and D8.

The condition that the sampled result SC1 of the reference clock signal CLKQ relative to the rising edge of the data D2 is the same as the sampled result SD1 of the reference clock signal CLKI represents the condition that the rising edge rising edge of the reference clock signal CLKQ phase-lead the rising edge of the data D2. The condition that the sampled result SC1 of the reference clock signal CLKQ relative to the rising edge of the data D2 is the same as the sampled result SD5 of the reference clock signal CLKI' represents the condition that the rising edge rising edge of the reference clock signal CLKQ phase-lag the rising edge of the data D2.

The sampling and detection method that uses four reference clock signals with different phases can also be implemented by using the configuration similar to the circuit in FIG. 2B that includes a plurality of flip-flops used to perform sampling and logic operation gates to perform status determination to further generate the phase detection result PD according to the logic operation result. The detail is thus not described herein.

The digital filter 120 is configured to keep performing accumulation on the phase detection result PD to generate a phase-adjusting signal PA.

In an embodiment, the digital filter 120 includes an integrator to accumulate numbers of times that the reference clock signals phase-lead and phase-lag the data signal. Take the configuration of FIG. 2B as an example, the digital filter 120 accumulates numbers of times of the occurrence of the logic operation results UP and DN generated during the operation of the phase detection circuit 110.

For example, the digital filter 120 may increment a certain value when the logic operation result UP is 1, and decrement the certain value when the logic operation result DN is 1 by setting parameters in the digital filter 120, e.g., a gain coefficient Kp and an integration coefficient Ki (not illustrated), and the digital filter 120 may output the accumulation result as the phase-adjusting signal PA.

The phase lock loop 130 is configured to generate a source clock signal CLKS. In different embodiments, the phase lock loop 130 can use any frequency and phase synchronization technology implemented by feedback control mechanism to generate the source clock signal CLKS having a certain frequency. The phase lock loop 130 of the present disclosure is not limited to any particular configuration.

The phase-interpolating circuit 140 is configured to perform phase adjustment on the source clock signal CLKS according to the phase-adjusting signal PA, in order to generate an injection clock signal CLKJ. Since the phase-adjusting signal PA is generated according to the phase detection result PD, the phase-interpolating circuit 140 substantially adjusts the phase of the source clock signal CLKS according to the phase detection result PD.

When the phase detection result PD shows the condition of "phase-lag", the phase-adjusting signal PA controls the phase-interpolating circuit 140 to shift forward the phase of the source clock signal CLKS to generate the injection clock signal CLKJ. When the phase detection result PD shows the condition of "phase-lead", the phase-adjusting signal PA controls the phase-interpolating circuit 140 to shift backward the phase of the source clock signal CLKS to generate the injection clock signal CLKJ.

In an embodiment, the source clock signal CLKS generated by the phase lock loop 130 has a single phase. The phase-adjusting signal PA is able to interpolate the injection clock signal CLKJ including four phases arranged in an order that have a phase difference of 90 degrees between each two of the phases in the order. The four phases can be simultaneously adjusted according to the phase-adjusting signal PA.

The oscillator circuit 150 is configured to generate the reference clock signals, e.g., CLKI, CLKI', CLKQ and CLKQ', according to the injection clock signal CLKJ.

Figure 4:
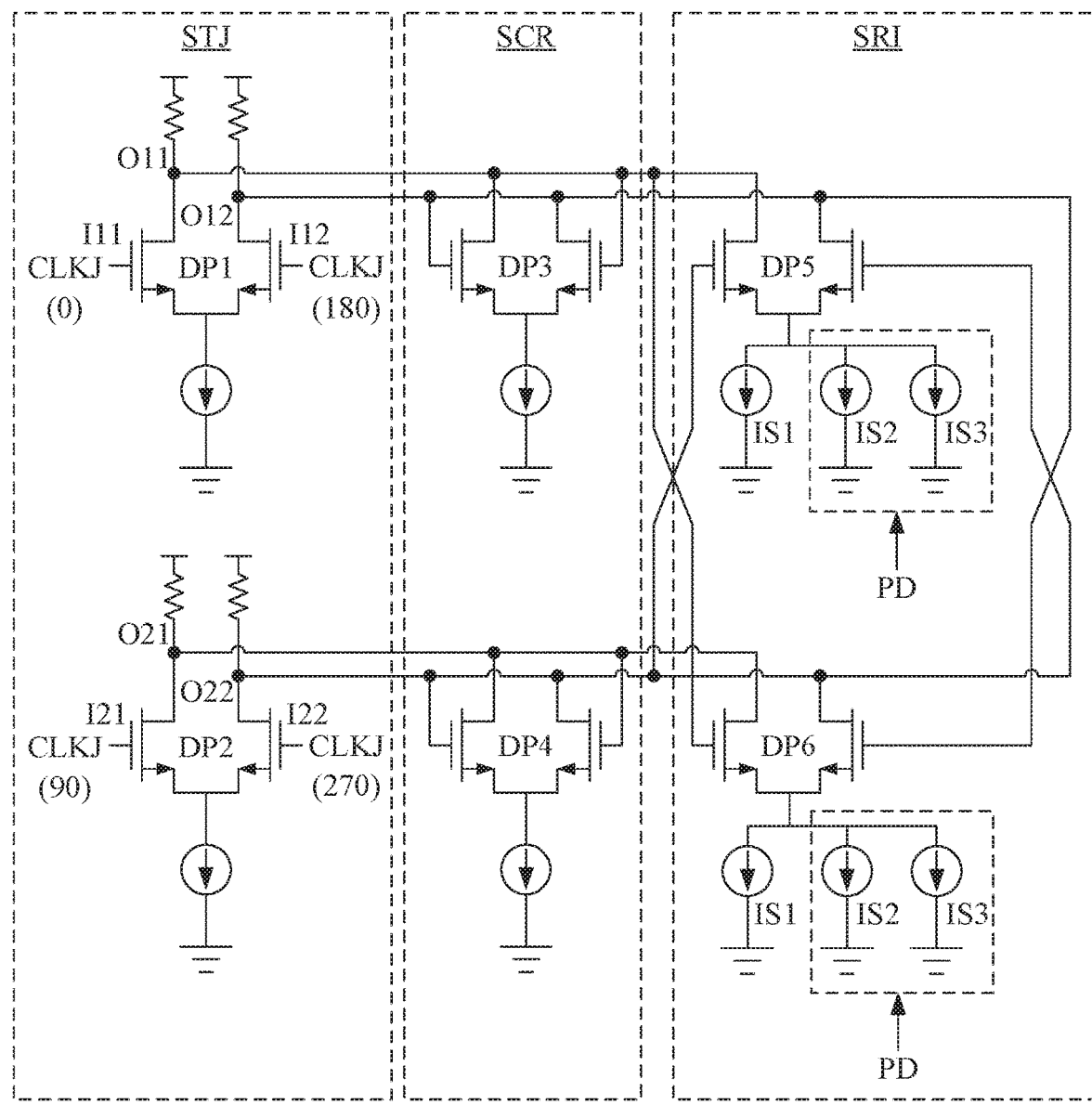
FIG. 4 illustrates a circuit diagram of the oscillator circuit according to an embodiment of the present disclosure.

Reference is now made to FIG. 4. FIG. 4 illustrates a circuit diagram of the oscillator circuit 150 according to an embodiment of the present disclosure.

In an embodiment, the oscillator circuit 150 includes an injection circuit stage STJ, an oscillator circuit stage SRI and a cross-coupling stage SCR for cross coupling the injection circuit stage STJ and the oscillator circuit stage SRI. The injection circuit stage STJ includes differential pairs DP1 and DP2. The cross-coupling stage SCR includes different pairs DP3 and DP4. The oscillator circuit stage SRI includes differential pairs DP5 and DP6.

An input terminal I11 of the differential pair DP1, an input terminal I21 of the different pair DP2, an input terminal I12 of the differential pair DP1 and an input terminal I22 of the different pair DP2 of the injection circuit stage STJ respectively receive the four phases of the injection clock signal CLKJ that have the phase difference of 90 degrees between each two of the phases in the order (labeled as 0, 90, 180 and 270 respectively in FIG. 3).

Further, an output terminal O11 of the differential pair DP1, an output terminal O21 of the different pair DP2, an output terminal O12 of the differential pair DP1 and an output terminal O22 of the different pair DP2 of the injection circuit stage STJ are electrically coupled to the oscillator circuit stage SRI and the cross-coupling stage SCR such that the four reference clock signals CLKI, CLKQ, CLKI' and CLKQ' that have the phase difference of 90 degrees between each two of the signals which are stable and are not easy to be interfered are generated according to the oscillation. The phases of the reference clock signals CLKI, CLKQ, CLKI' and CLKQ' follow the phases of the injection clock signal CLKJ.

The oscillator circuit 150 can selectively perform sampling by providing the reference clock signals CLKI and CLKI' to the phase detection circuit 110 in the full rate mode, as illustrated in FIG. 2A, or perform sampling by providing the reference clock signals CLKI, CLKQ, CLKI' and CLKQ' to the phase detection circuit 110 in the half rate mode, as illustrated in FIG. 3.

In an embodiment, the oscillator circuit stage SRI of the oscillator circuit 150 operates according to three current sources IS1, IS2 and IS3. The current source IS1 is always in operation and the operation of the current sources IS2 and IS3 are controlled by the phase detection result PD to provide a quick adjusting mechanism of the phases of the reference clock signals.

For example, the current source IS2 turns off to lower the frequency of the reference clock signals to shift backward the phases thereof only when the phase detection result PD shows that the phases of reference clock signals phase-lead the data signal DATA, and turns on under other conditions. The current source IS3 turns on to increase the frequency of the reference clock signals to shift forward the phases thereof only when the phase detection result PD shows that the phases of reference clock signals phase-lag the data signal DATA, and turns off under other conditions. For the mechanism of adjusting the reference clock signals described above, the delay of the reaction of the clock data recovery apparatus 100 can be greatly reduced since the information of the phase detection result PD needs not to be transmitted through the digital filter 120 and the phase-interpolating circuit 140. The frequency deviation can be decreased quickly under the condition that a large frequency deviation is presented.

In such a design, a quick adjusting mechanism can be provided when a rapid change of status is presented under the condition that the data signal DATA is transmitted by using spread spectrum technology with the use of, for example, a triangular wave carrier.

As a result, the clock data recovery apparatus of the present disclosure not only saves the area and increases the adjustability by using the digital filter, but also avoid the unlocked condition during the analog switching or the accumulation of noise when the input data does not have transition by using the phase lock loop to generate the source clock signal. Further, by using the injection locking mechanism to transfer the phases of the phase-interpolating circuit to the oscillator circuit, the oscillator circuit is able to adjust the phase in a way identical to continuous analog modification. The adjusting mechanism is not affected by the design quality of the phase-interpolating circuit that results in bit error. A better linearity ad power consumption performance can also be maintained.

It is appreciated that the configuration of the circuits described above is merely an example. In other embodiments, other circuit configurations can be used to obtain the same function to accomplish the object of stable and accurate clock data recovery.

Figure 5:
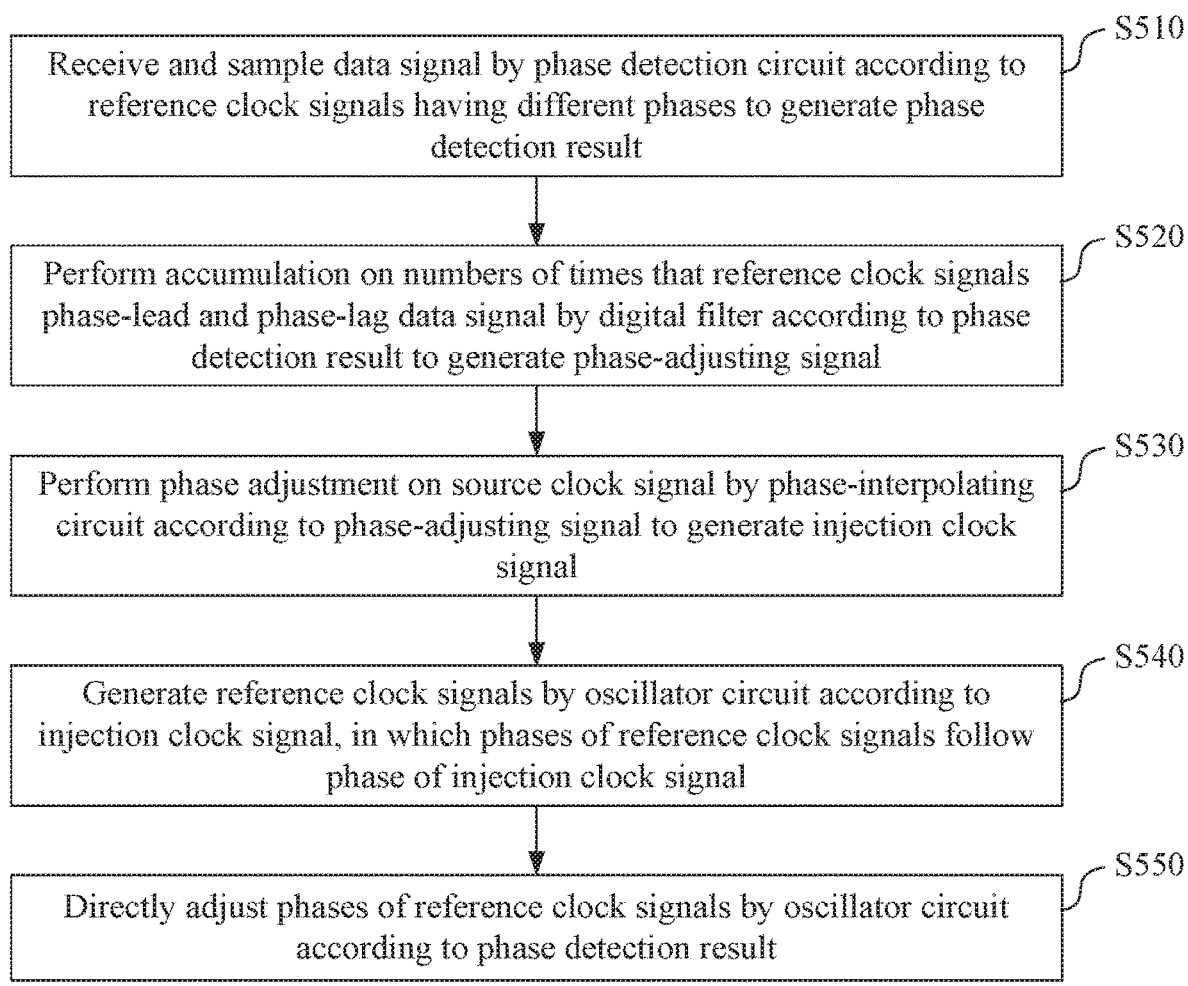
FIG. 5 illustrates a flow chart of a clock data recovery method according to an embodiment of the present disclosure.

Reference is now made to FIG. 5. FIG. 5 illustrates a flow chart of a clock data recovery method 500 according to an embodiment of the present disclosure.

In addition to the apparatus described above, the present disclosure further provides the clock data recovery method 500 that can be used in such as, but not limited to, the clock data recovery apparatus 100 in FIG. 1. As illustrated in FIG. 5, an embodiment of the clock data recovery method 500 includes the following steps.

In step S510, the data signal DATA is received and sampled by the phase detection circuit 110 according to the reference clock signals having different phases to generate the phase detection result PD.

In step S520, accumulation is performed on numbers of times that the reference clock signals phase-lead and phase-lag the data signal DATA by the digital filter 120 according to the phase detection result PD, to generate the phase-adjusting signal PA.

In step S530, phase adjustment is performed on the source clock signal CLKS by the phase-interpolating circuit 140 according to the phase-adjusting signal PA, in order to generate the injection clock signal CLKJ.

In step S540, the reference clock signals are generated by the oscillator circuit 150 according to the injection clock signal CLKJ, in which the phases of the reference clock signals follow the phase of the injection clock signal CLKJ.

In step S550, the phases of the reference clock signals are directly adjusted by the oscillator circuit 150 according to the phase detection result PD. When the phase detection result PD shows the condition of "phase-lead", the oscillator circuit 150 shifts backward the phase of the reference clock signals. When the phase detection result PD shows the condition of "phase-lag", the oscillator circuit 150 shifts forward the phase of the reference clock signals.

It is appreciated that the embodiments described above are merely an example. In other embodiments, it should be appreciated that many modifications and changes may be made by those of ordinary skill in the art without departing, from the spirit of the disclosure.

In summary, the clock data recovery apparatus and the clock data recovery method of the present disclosure have the advantages of both the digital circuit and the analog circuit. Not only the clock data recovery can be performed stably and accurately, but also a fast-tracking mechanism can be provided.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A clock data recovery apparatus, comprising:
   a phase detection circuit configured to receive and sample a data signal according to a plurality of reference clock signals having different phases, to generate a phase detection result;
   a digital filter configured to perform accumulation on numbers of times that the reference clock signals phase-lead and phase-lag the data signal according to the phase detection result, to generate a phase-adjusting signal;
   a phase-interpolating circuit configured to perform phase adjustment on a source clock signal according to the phase-adjusting signal, in order to generate an injection clock signal; and
   an oscillator circuit configured to generate the reference clock signals according to the injection clock signal, in which the phases of the reference clock signals follow the phase of the injection clock signal.

2. The clock data recovery apparatus of claim 1, wherein the oscillator circuit is further configured to adjust the phases of the reference clock signals directly according to the phase detection result so as to shift backward the phases of the reference clock signals when the phase detection result shows that the reference clock signals phase-lead the data signal, and to shift forward the phases of the reference clock signals when the phase detection result shows that the reference clock signals phase-lag the data signal.

3. The clock data recovery apparatus of claim 1, wherein the phase detection circuit comprises a plurality of flip-flops and a plurality of logic operation gates, the flip-flops sample the data signal according to the reference clock signals to generate a plurality of sampled results, and the logic operation gates perform logic operation on the sampled results to generate the phase detection result.

4. The clock data recovery apparatus of claim 1, wherein the clock data recovery apparatus further comprises a phase lock loop configured to generate the source clock signal having a same frequency as the data signal, and the oscillator circuit is configured to generate two of the reference clock signals having a phase difference of 180 degrees according to the injection clock signal.

5. The clock data recovery apparatus of claim 4, wherein the reference clock signals comprise a first reference clock signal and a second reference clock signal having the phase difference of 180 degrees such that the phase detection circuit performs consecutive sampling on the data signal according to the first reference clock signal and the second reference clock signal to generate three sampled results;
   wherein the first reference clock signal phase-lags the data signal when the first two of the three sampled results are the same; and
   the first reference clock signal phase-lead the data signal when the last two of the three sampled results are the same.

6. The clock data recovery apparatus of claim 1, wherein the clock data recovery apparatus further comprises a phase lock loop configured to generate the source clock signal having a frequency that is half of the frequency of the data signal, and the oscillator circuit is configured to generate four of the reference clock signals having a phase difference of 90 degrees between each two reference clock signals in an order, according to the injection clock signal.

7. The clock data recovery apparatus of claim 6, wherein the reference clock signals comprise a first reference clock signal, a second reference clock signal, a third reference clock signal and a fourth reference clock signal such that the phase detection circuit performs consecutive sampling on the data signal accordingly to generate a first sampled result, a second sampled result, a third sampled result and a fourth sampled result;

wherein when the first sampled result and the fourth sampled result are the same or when the third sampled result and the second sampled result are the same, the first reference clock signal or the third reference clock signal phase-leads the data signal;

wherein when the first sampled result and the second sampled result are the same or when the third sampled result and the fourth sampled result are the same, the first reference clock signal or the third reference clock signal phase-lags the data signal.

8. The clock data recovery apparatus of claim 1, wherein the oscillator circuit comprises an injection circuit stage, an oscillator circuit stage and a cross-coupling stage for cross coupling the injection circuit stage and the oscillator circuit stage, and the injection circuit stage is configured to receive the injection clock signal to transmit the injection clock signal to the oscillator circuit stage through the cross-coupling stage to generate oscillation to further output the reference clock signals from the injection circuit stage.

9. The clock data recovery apparatus of claim 1, wherein the oscillator circuit operates according to a first current source, a second current source and a third current source, in which the first current source is always in operation, the second current source turns off only when the phase detection result shows that the phases of reference clock signals phase-lead the data signal, and the third current source turns on only when the phase detection result shows that the phases of reference clock signals phase-lag the data signal.

10. A clock data recovery method used in a clock data recovery apparatus, comprising:

receiving and sampling a data signal by a phase detection circuit according to a plurality of reference clock signals having different phases, to generate a phase detection result;

performing accumulation on numbers of times that the reference clock signals phase-lead and phase-lag the data signal by a digital filter according to the phase detection result, to generate a phase-adjusting signal;

performing phase adjustment on a source clock signal by a phase-interpolating circuit according to the phase-adjusting signal, in order to generate an injection clock signal; and generating the reference clock signals by an oscillator circuit according to the injection clock signal, in which the phases of the reference clock signals follow the phase of the injection clock signal.

11. The clock data recovery method of claim 10, further comprising:

adjusting the phases of the reference clock signals by the oscillator circuit directly according to the phase detection result so as to shift backward the phases of the reference clock signals when the phase detection result shows that the reference clock signals phase-lead the data signal, and to shift forward the phases of the reference clock signals when the phase detection result shows that the phases of the reference clock signals phase-lag the data signal.

12. The clock data recovery method of claim 10, wherein the phase detection circuit comprises a plurality of flip-flops and a plurality of logic operation gates, and the clock data recovery method further comprises:

sampling the data signal by the flip-flops according to the reference clock signals to generate a plurality of sampled results; and performing logic operation on the sampled results by the logic operation gates to generate the phase detection result.

13. The clock data recovery method of claim 10, wherein the clock data recovery apparatus further comprises a phase lock loop, and the clock data recovery method further comprises:

generating the source clock signal having a same frequency as the data signal by phase lock loop; and generating two of the reference clock signals having a phase difference of 180 degrees by the oscillator circuit according to the injection clock signal.

14. The clock data recovery method of claim 13, wherein the reference clock signals comprise a first reference clock signal and a second reference clock signal having the phase difference of 180 degrees, and the clock data recovery method further comprises:

performing consecutive sampling on the data signal by the phase detection circuit according to the first reference clock signal and the second reference clock signal to generate three sampled results;

wherein the first reference clock signal phase-lags the data signal when the first two of the three sampled results are the same; and the first reference clock signal phase-leads the data signal when the last two of the three sampled results are the same.

15. The clock data recovery method of claim 10, wherein the clock data recovery apparatus further comprises a phase lock loop, and the clock data recovery method further comprises:

generating the source clock signal having a frequency that is half of the frequency of the data signal by the phase lock loop; and generating four of the reference clock signals having a phase difference of 90 degrees between each two reference clock signals in an order by the oscillator circuit according to the injection clock signal.

16. The clock data recovery method of claim 15, wherein the reference clock signals comprise a first reference clock signal, a second reference clock signal, a third reference clock signal and a fourth reference clock signal, and the clock data recovery method further comprises:

performing consecutive sampling on the data signal accordingly by the phase detection circuit to generate a first sampled result, a second sampled result, a third sampled result and a fourth sampled result;

wherein when the first sampled result and the fourth sampled result are the same or when the third sampled result and the second sampled result are the same, the first reference clock signal or the third reference clock signal phase-leads the data signal;

when the first sampled result and the second sampled result are the same or when the third sampled result and the fourth sampled result are the same, the first reference clock signal or the third reference clock signal phase-lags the data signal.

17. The clock data recovery method of claim 10, wherein the oscillator circuit comprises an injection circuit stage, an oscillator circuit stage and a cross-coupling stage for cross coupling the injection circuit stage and the oscillator circuit stage, and the clock data recovery method further comprises:

receiving the injection clock signal to transmit the injection clock signal to the oscillator circuit stage by the injection circuit stage through the cross-coupling stage to generate oscillation; and outputting the reference clock signals from the injection circuit stage.

18. The clock data recovery method of claim 10, wherein the oscillator circuit operates according to a first current source, a second current source and a third current source, in which the first current source is always in operation, the second current source turns off only when the phase detection result shows that the phases of reference clock signals phase-lead the data signal and the third current source turns on only when the phase detection result shows that the phases of reference clock signals phase-lag the data signal.

* * * * *